(12) United States Patent
Camparo et al.

(10) Patent No.: US 11,190,195 B1
(45) Date of Patent: Nov. 30, 2021

(54) LASER AND LAMP INTEGRATED PULSED OPTICALLY-PUMPED PHYSICS PACKAGES FOR ATOMIC CLOCKS

(71) Applicant: The Aerospace Corporation, El Segundo, CA (US)

(72) Inventors: James Camparo, Redondo Beach, CA (US); Michael Huang, Torrance, CA (US); Travis Driskell, Santa Monica, CA (US); Daniele Monahan, El Segundo, CA (US); Zachary Warren, Redondo Beach, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 134 days.

(21) Appl. No.: 17/062,490

(22) Filed: Oct. 2, 2020

(51) Int. Cl.
*H03L 7/26* (2006.01)
*H01S 1/06* (2006.01)
*G04F 5/14* (2006.01)

(52) U.S. Cl.
CPC .............. *H03L 7/26* (2013.01); *G04F 5/14* (2013.01); *H01S 1/06* (2013.01)

(58) Field of Classification Search
CPC .............. H03L 7/26; G04F 5/14; G04F 5/145
See application file for complete search history.

(56) References Cited

U.S. PATENT DOCUMENTS

| | | | | |
|---|---|---|---|---|
| 3,165,705 A | * | 1/1965 | Dicke | G04F 5/14 331/3 |
| 5,657,340 A | * | 8/1997 | Camparo | G04F 5/14 250/251 |
| 8,050,301 B2 | | 11/2011 | Wells et al. | |
| 8,442,083 B2 | | 5/2013 | Wells et al. | |
| 8,873,061 B1 | | 10/2014 | Wells et al. | |

OTHER PUBLICATIONS

Camparo, James C. The rubidium atomic clock and basic research. Aerospace Corp El Segundo CA Physical Sciences Labs, 2007. (Year: 2007).*
Bazurto, "Spectral emission from the alkali inductively-coupled plasma: Theory and experiment," AIP Advances 8: 045319, 19 pages (2018).

(Continued)

*Primary Examiner* — Ryan Johnson
(74) *Attorney, Agent, or Firm* — Eversheds Sutherland (US)

(57) ABSTRACT

A physics package for an atomic clock is provided herein. The atomic clock may include a resonance cell storing alkali vapor having first and second hyperfine ground states and an excited state, a light source to transmit light through the resonance cell at a frequency corresponding to electronic decay from the excited state to the first ground state, and a photodetector to receive light from the light source. The physics package may include a laser, and controller circuitry to, at a first time, allow light from the laser to optically pump the alkali vapor from the first hyperfine ground state to the excited state; and at a second time, allow the photodetector to receive light source light from the resonance cell while inhibiting light from the laser from optically pumping the alkali vapor in the resonance cell.

22 Claims, 11 Drawing Sheets

(56) References Cited

OTHER PUBLICATIONS

Camparo, "Light-shifts of an integrated filter-cell rubidium atomic clock," Aerospace Report No. TOR-2015-02236, 11 pages (2015).
Camparo et al., "The mercury-ion clock and the pulsed-laser rubidium clock: Near-term candidates for future GPS deployment," Aerospace Report No. TOR-2015-03893, 13 pages (2015).
Camparo et al., "A nonempirical model of the gas-cell atomic frequency standard," Journal of Applied Physics 59: 301-312 (1986).
Camparo et al., "Fundamental stability limits for the diode-laser-pumped rubidium atomic frequency standard," Journal of Applied Physics 59: 3313-3317 (1986).
Dupuis et al., "Rubidium frequency standard for the GPS IIF program and modifications for the RAFSMOD program," 2008 IEEE International Frequency Control Symposium: 655-660 (2008).
Encalada et al., "Noble-gas loss in alkali rf-discharge lamps and its possible dependence on electron temperature," IEEE Trans. Instrum. and Meas. 63(11): 2642-2650 (2014).
Formichella et al., "Influence of the ac-Stark shift GPS atomic clock timekeeping," Appl. Phys. Lett 110: 043506, 5 pages (2017).
Formichella et al., "The ac Stark shift and space-borne rubidium atomic clocks," J. Appl. Phys. 120: 194501, 10 pages (2016).
Frueholz et al., "Lamp reliability studies for improved satellite rubidium frequency standard," Proc. 13th Annual Precise Time and Time Interval (PTTI) Meeting, Institute of Navigation, Manassas VA: 767-790 (1981).
Happer, "Optical Pumping," Rev. Mod. Phys. 44(2): 169-249 (1972).
Klimcak et al., "Alkali metal consumption by discharge lamps fabricated by GE-180 aluminosilicate glass," Proc. Intern. Freq. Contr. Symp., IEEE Press, Piscataway NJ: 180-187 (2015).
Levi et al., "Pulsed optically pumped RB clock: a high stability vapor cell frequency standard," 2013 Joint UFFC, EFTF and PFM Symposium: 599-605 (2013).
Levi et al., "Precision test of the ac Stark shift in a rubidium atomic vapor," Phys. Rev. A 93: 023433, 9 pages (2016).
Mathur et al., "Light shifts in the alkali atoms," 171(1): 11-19 (1968).
Series, "Thirty years of optical pumping," Contemp. Phys. 22(5): 487-509 (1981).
Vanier et al., "On the signal-to-noise ratio and short-term stability of passive rubidium frequency standards," IEEE Trans. Instrum. and Meas. 30(4): 277-282 (1981).

* cited by examiner

LASER AND LAMP INTEGRATED PULSED OPTICALLY-PUMPED PHYSICS PACKAGES FOR ATOMIC CLOCKS

FIELD

This application relates to atomic clocks.

BACKGROUND

The rubidium atomic frequency standard (RAFS) is one of the most frequently used type of atomic clocks for global positioning system (GPS) satellites, and may be referred to as GPS-RAFS. FIG. 1 schematically illustrates a previously known physics package for a RAFS atomic clock for use in GPS satellites (GPS-RAFS). Physics package 100 includes rubidium-87 ($Rb^{87}$) discharge lamp 101, rubidium-85 ($Rb^{85}$) filter cell 111, $Rb^{87}$ resonance cell 121, photodetector 131 (e.g., photodiode), and microwave cavity 141 in which $Rb^{87}$ resonance cell 121 is located. $Rb^{87}$ discharge lamp 101 includes $Rb^{87}$ vapor and a carrier gas such as xenon (Xe) or krypton (Kr), and generates light at first and second frequencies respectively corresponding to decay of excited $Rb^{87}$ electrons to the ground state hyperfine F=1 and F=2 levels with approximately equal distributions. $Rb^{85}$ filter cell 111 includes $Rb^{85}$ vapor, the electrons of which are excited from the ground state F=3 level at a frequency that coincides with the F=2 level of $Rb^{87}$ and thus absorbs (filters) light at the second frequency, allowing light of the first frequency to pass through. The filtered light at the first frequency irradiates $Rb^{87}$ resonance cell 121, which includes $Rb^{87}$ vapor that is excited from the F=1 hyperfine ground state and thus absorbs light at that frequency. The excited electrons then decay which repopulates the F=1 and F=2 hyperfine levels. The F=1 level is repeatedly excited by the filtered light, whereas the F=2 level is not, thus generating a nonthermal population distribution in which an increase in the F=2 electrons decreases the number of F=1 electrons that are available to absorb filtered light, and thus decreases absorption by $Rb^{87}$ resonance cell 121 as measured by photodetector 131. As such, in addition to optically exciting the $Rb^{87}$ vapor, the $Rb^{87}$ discharge lamp is used to monitor the absorption of the $^{87}Rb$ within resonance cell 121 via the intensity of light that photodetector 131 receives.

In order to decrease the population of F=2 electrons and thus promote absorption by F=1 electrons in $Rb^{87}$ resonance cell 121, microwave cavity 141 is tuned to the hyperfine-splitting frequency of about 6.8 GHz between the F=1 and F=2 levels. More specifically, the output of photodetector 131 is minimized by applying a correction to the frequency of a crystal oscillator (not illustrated) that is used to drive the frequency of microwave cavity 141. When the frequency of the crystal oscillator is properly corrected, the frequency of the microwave cavity 141 transfers the maximum number of electrons from the F=2 level to the F=1 level where they may absorb the maximum amount of filtered light from $Rb^{87}$ discharge lamp 101 and thus minimize the amount of light received by photodetector 131. The corrected frequency of the crystal oscillator, which is locked to the absorption spectrum of $Rb^{87}$, provides the frequency of the atomic clock including physics package 100.

However, GPS RAFS atomic clocks are not perfect. For example, the long-term stability (e.g., at frequency averaging times of greater than about $10^5$ seconds) may be limited by changes in clock frequency that are caused by changes in the amount of light generated by $Rb^{87}$ discharge lamp 101. For example, a 1% change in the intensity of the light generated by $Rb^{87}$ discharge lamp 101 may change the hyperfine-splitting frequency by about 1 part in $10^{12}$ via the ac-Stark shift, and thus may alter the frequencies to which microwave cavity 141 and the crystal oscillator are tuned. Additionally, the short-term stability of GPS RAFS atomic clocks (e.g., at frequency averaging times of less than about $10^4$ seconds) may be limited by the amount of atomic signal, e.g., the amount of light the $Rb^{87}$ absorbs. For example, changes in the amount of light generated by $Rb^{87}$ discharge lamp 101 may impact the optical excitation of the $Rb^{87}$, and thus may alter the amount of light absorbed by the $Rb^{87}$. Such instabilities in the long-term and short-term stability of GPS RAFS atomic clock frequency contribute to signal-in-space user-range-error (SIS-URE). Furthermore, $Rb^{87}$ discharge lamp 101 may have a limited lifetime, and may not readily be serviced or replaced if located on a satellite.

SUMMARY

Laser and lamp integrated pulsed optically-pumped physics packages for atomic clocks are provided herein.

For example, as described in greater detail below, the present physics packages for atomic clocks may include a pulsed or gated laser to optically pump a resonance cell storing an alkali vapor such as $Rb^{87}$ or cesium-133 ($Cs^{133}$), and a light source (such as an alkali discharge lamp) to monitor the absorption of the optically pumped resonance cell. The higher intensity and narrow linewidth of the laser provides significantly higher atomic signals than may be obtained using only light from the light source to optically excite the alkali within the resonance cell, and thus may significantly increase the short-term stability of the atomic clock. Additionally, the light from the light source may be used as a probe during laser-off periods, instead of as an optical pump, and therefore may be used at significantly reduced intensity which may extend the life of the light source and inhibit changes in clock frequency, and may significantly increase the long-term stability of the atomic clock. As such, the present physics packages may significantly reduce SIS-URE and may significantly increase the lifetime of the atomic clock. Additionally, in some examples, the present physics packages selectively may be used in either a first mode in which the laser is used to optically pump the resonance cell, or a second mode in which the light source is used to pump the resonance cell. As such, even after the end of the laser's lifetime, the physics package may continue to be successfully used in a GPS RAFS atomic clock.

Under one aspect, a physics package for an atomic clock is provided herein. The atomic clock may include a resonance cell storing an alkali vapor having first and second hyperfine ground states and an excited state, a light source configured to transmit light through the resonance cell at a frequency corresponding to electronic decay from the excited state to the first hyperfine ground state, and a photodetector configured to receive the light from the light source. The physics package may include a laser and controller circuitry. The controller circuitry may be configured to, at a first time, allow light from the laser to optically pump the alkali vapor in the resonance cell from the first hyperfine ground state to the excited state. The controller circuitry may be configured to, at a second time, allow the photodetector to receive lamp light from the light source through the resonance cell while inhibiting light from the laser from optically pumping the alkali vapor in the resonance cell.

In some examples, the alkali vapor in the resonance cell includes $Rb^{87}$, the light source includes a $Rb^{87}$ discharge lamp, and the physics package further includes a $Rb^{85}$ filter cell disposed between the $Rb^{87}$ discharge lamp and the resonance cell, and a microwave cell configured to transfer electrons of the alkali vapor from the second hyperfine ground state to the first hyperfine ground state. In other examples, the alkali vapor in the resonance cell includes $Cs^{133}$, the light source includes a light emitting diode, and the physics package further includes a microwave cell configured to transfer electrons of the alkali vapor from the second hyperfine ground state to the first hyperfine ground state.

In some examples, the laser includes a pulsed laser.

Some examples including an optical gate configured to inhibit the laser from optically pumping the alkali vapor in the resonance cell at the second time. The optical gate may include an optical pulsing device, acousto-optic modulator, liquid crystal switch, shutter, mechanical chopper, or electro-optical modulator or photo-elastic modulator paired with a polarizer.

In some examples, the physics package further includes one or more optical components making a beam from the laser collinear with light from the light source.

In some examples, the controller circuitry gates the photodetector.

In some examples, controller circuitry further is configured to, at a third time, increase power to the light source to optically pump the alkali vapor in the resonance cell from the first hyperfine ground state to the excited state; and while the light source is optically pumping the alkali vapor in the resonance cell, allow the photodetector to receive the light from the light source through the resonance cell.

In some examples, the physics package further includes one or more optical fibers carrying light from the light source or from the laser.

In some examples, the light source includes a discharge lamp.

Under another aspect, a method for use with an atomic clock is provided herein. The atomic clock may include a resonance cell storing an alkali vapor having first and second hyperfine ground states and an excited state, a light source configured to transmit light through the resonance cell at a frequency corresponding to electronic decay from the excited state to the first hyperfine ground state, and a photodetector configured to receive the light from the light source. The method may include, at a first time, allowing light from a laser to optically pump the alkali vapor in the resonance cell from the first hyperfine ground state to the excited state. The method also may include, at a second time, allowing the photodetector to receive light from the light source through the resonance cell while inhibiting light from the laser from optically pumping the alkali vapor in the resonance cell.

In some examples, the alkali vapor in the resonance cell includes $Rb^{87}$, the light source includes a $Rb^{87}$ discharge lamp, a $Rb^{85}$ filter cell is disposed between the $Rb^{87}$ discharge lamp and the resonance cell, and a microwave cell transfers electrons of the alkali vapor from the second hyperfine ground state to the first hyperfine ground state. In other examples, the alkali vapor in the resonance cell includes $Cs^{133}$, the light source includes a light emitting diode, and the physics package further includes a microwave cell configured to transfer electrons of the alkali vapor from the second hyperfine ground state to the first hyperfine ground state.

In some examples, the laser includes a pulsed laser.

In some examples, the laser is inhibited from optically pumping the alkali vapor in the resonance cell at the second time using an optical gate. In some examples, the optical gate includes an optical pulsing device, acousto-optic modulator, liquid crystal switch, shutter, mechanical chopper, or electro-optical modulator or photo-elastic modulator paired with a polarizer.

In some examples, the method further includes making a beam from the laser collinear with light from the light source.

In some examples, the photodetector is gated by control circuitry.

In some examples, the method further includes, at a third time, increasing power to the light source to optically pump the alkali vapor in the resonance cell from the first hyperfine ground state to the excited state; and while the light source is optically pumping the alkali vapor in the resonance cell, allowing the photodetector to receive the light from the light source through the resonance cell.

In some examples, one or more optical fibers carry light from the light source or from the laser.

In some examples, the light source includes a discharge lamp.

DETAILED DESCRIPTION

Laser and lamp integrated pulsed optically-pumped ("LaLI-POP") physics packages for atomic clocks are provided herein. As used herein, the terms "physics package for an atomic clock" and, more briefly, "physics package," are intended to mean a set of components that may be included within an atomic clock and that have physical properties that may be used to control the frequency of the atomic clock. The atomic clock may include components outside of the physics package, such as a crystal oscillator and frequency correction circuitry, that are well known in the art.

The present physics packages may solve problems associated with the short-term and long-term stability of previously known GPS-RAFS atomic clocks. For example, the present physics packages may enhance short-term frequency stability of the atomic clock by using a pump laser to excite an alkali vapor (such as $Rb^{87}$ or $Cs^{133}$) at relatively high levels, leading to efficient optical pumping, and also may enhance short-term and long-term stability of the atomic clock by using a separate probe light source (e.g., lamp) to probe the excited alkali vapor at relatively low levels.

Figure 2A:
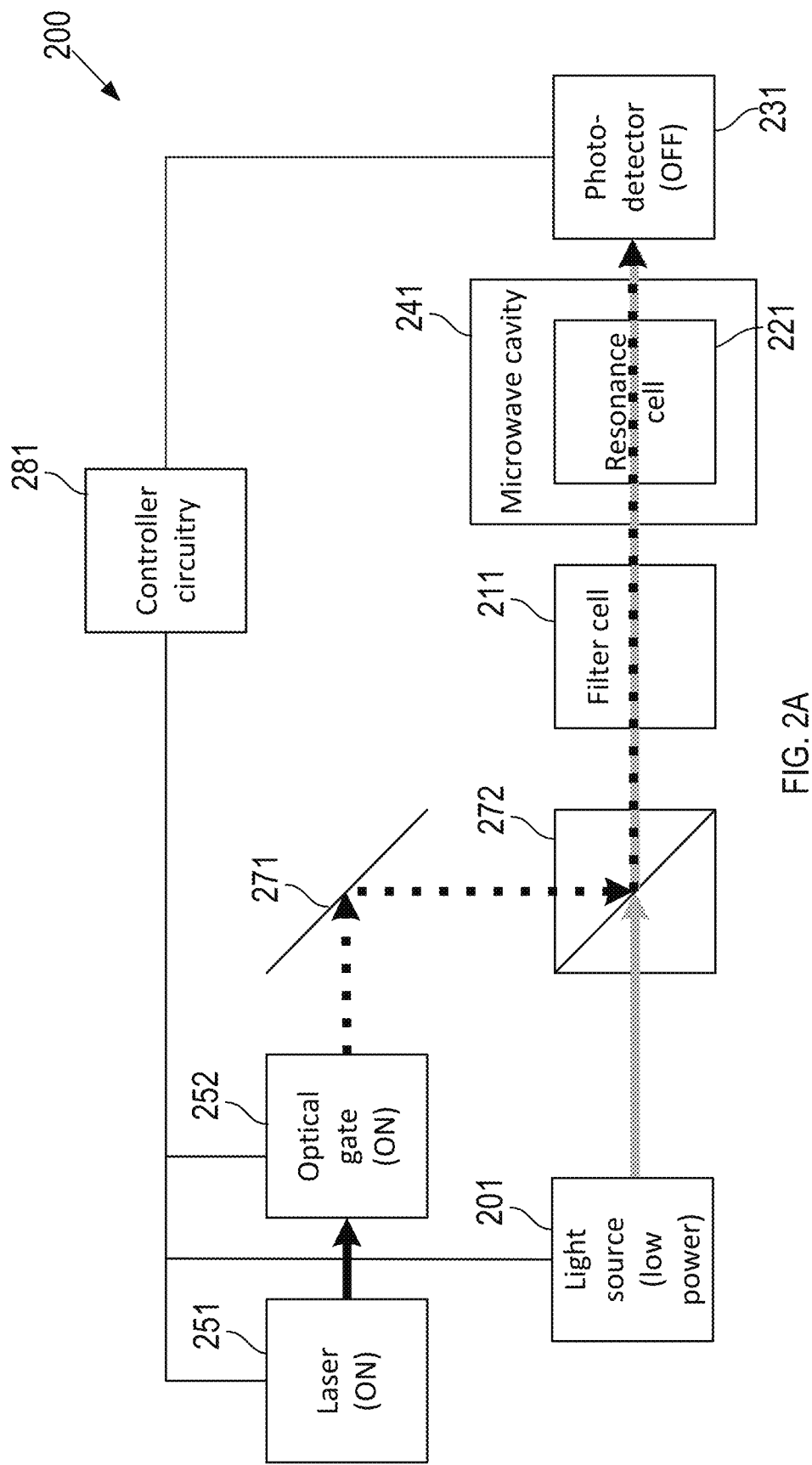
FIGS. 2A-2B schematically illustrate an example laser and lamp integrated pulsed optically-pumped (LaLI-POP) physics package for an atomic clock in a first mode of operation such as provided herein.
Figure 2B:
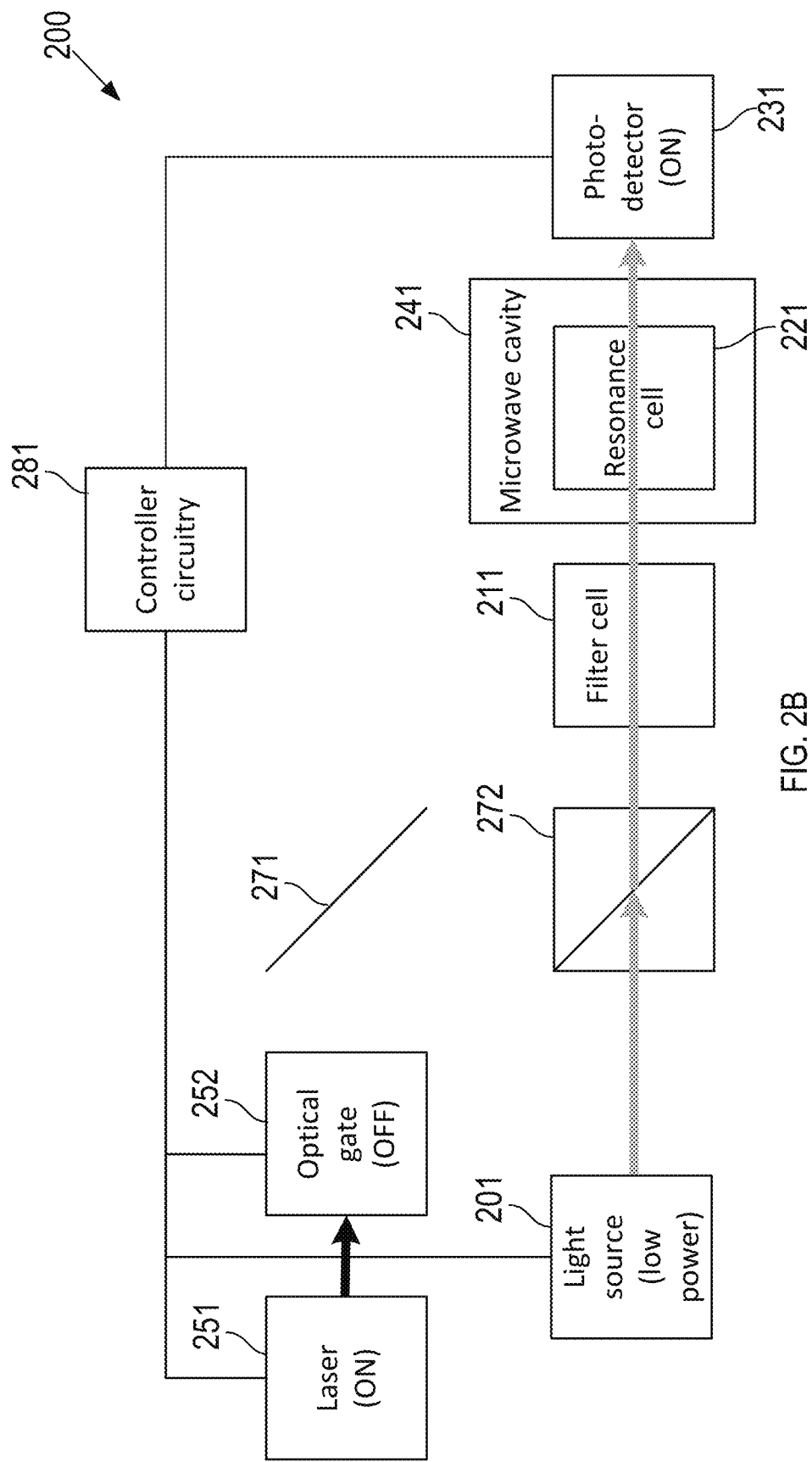

FIGS. 2A-2B schematically illustrate an example LaLI-POP physics package for an atomic clock in a first mode of operation such as provided herein. Physics package 200 includes a light source 201, an optional filter cell 211, an alkali vapor resonance cell 221, photodetector 231, and microwave cavity 241 in which the alkali vapor resonance cell 221 is located.

Optionally, filter cell 211 (if provided) may be located within microwave cavity 241 as well. In nonlimiting examples in which the alkali vapor is or includes $Rb^{87}$, the light source 201 may include a rubidium-87 ($Rb^{87}$) discharge lamp such as described with reference to lamp 101 illustrated in FIG. 1, or a $Rb^{85}$ discharge lamp, or other suitable light source, such as a light emitting diode (LED), the optional filter cell 211 may include a rubidium-85 ($Rb^{85}$) filter cell such as described with reference to filter cell 111 illustrated in FIG. 1 (and may be omitted if the light source includes a $Rb^{85}$ discharge lamp or LED), and the alkali vapor resonance cell 221 may include a $Rb^{87}$ resonance cell such as described with reference to resonance cell 121 illustrated in FIG. 1. In nonlimiting examples in which the alkali vapor is or includes $Cs^{133}$, the light source 201 may include an LED and the filter cell may be omitted. Additionally, physics package 200 includes laser 251 and controller circuitry 281, and optionally includes some or all of optical gate 252 and optical elements 271 and 272. Controller circuitry 281 may include any suitable combination of hardware (e.g., application specific integrated circuit (ASIC), field programmable gate array (FPGA), central processing unit (CPU), or the like) and software (e.g., instructions causing the hardware to implement the functionality described herein), and may be operably coupled to, and configured to control, laser 251, optional optical gate 252, light source 201, and photodetector 231 in a manner such as described in greater detail below. In some examples, physics package 200 may be prepared by modifying a previously prepared physics package 100 or by modifying a previously prepared atomic clock including physics package 100 so as to further include laser 251 and controller circuitry 281, and optionally also to include optical gate 252 and optical elements 271 and 272. However, it will be appreciated that any other suitable manner of preparing physics package 200 may be used.

Referring now to FIG. 2A, laser 251 may be configured to optically pump the alkali vapor (e.g., $Rb^{87}$ or $Cs^{133}$ vapor) in resonance cell 221 from a first hyperfine ground state (F=1) to an excited state, e.g., may be tuned so as to generate the appropriate frequency to induce such transition. The light from laser 251 may be pulsed or gated so as to optically pump the alkali vapor in resonance cell 221 repeatedly, but only at certain times, under the control of controller circuitry 281. For example, laser 251 may include a continuous-wave (CW) laser, such as a fiber laser, diode laser, vertical cavity surface emitting laser (VCSEL), or diode pumped solid state (DPSS) laser, and may be suitably pulsed or gated using an external optical gate 252 controlled by controller circuitry 281, such as an optical pulsing device (e.g., semiconductor optical amplifier), acousto-optic modulator, liquid crystal switch, shutter, mechanical chopper, electro-optical modulator or photo-elastic modulator paired with a polarizer, or the like. Or, for example, laser 251 may include a pulsed laser, such as a Q-switched laser, mode locked laser, ultrafast laser, or the like, controlled by controller circuitry 281. In still other examples, laser 251 may be repeatedly turned on and off by controller circuitry 281. It will be appreciated that any suitable type of laser, and manner of using the laser to optically pump the alkali vapor in the resonance cell only at certain times, may be used. At the particular time illustrated in FIG. 2A, laser 251 is "ON" and optical gate 252 also is "ON", which is intended to mean that the laser is generating excitation light and that the optical gate 252 is permitting that excitation light to irradiate resonance cell 221. At other times such as described with reference to FIG. 2B below, laser 251 may remain "ON" while optical gate 252 is "OFF," which is intended to mean that the laser is generating excitation light but the optical gate 252 is inhibiting that excitation light from irradiating resonance cell 221. Such "ON" and "OFF" states readily may be implemented for other types of lasers (e.g., pulsed lasers) or other ways to pulse or gate lasers such that the laser light only irradiates resonance cell 221 at certain times.

The frequenc(ies) of laser light emitted by laser 251 may be selected (e.g., tuned) to excite only one of the hyperfine ground states of the alkali vapor (e.g., $Rb^{87}$ or $Cs^{133}$ vapor) in resonance cell 221. For example, laser 251 may be selected or tuned to emit light at a wavelength of about 780 nm or 795 nm to excite one of the hyperfine ground states of $Rb^{87}$ vapor. As used herein, the terms "about" and "approximately" mean within 10% of the stated value. In some examples, the laser 251 may include a single longitudinal mode laser that is selected or tuned so as to excite atoms out of only one of the hyperfine ground states and does not excite atoms out of both of the hyperfine ground states. In embodiments that do not employ a single longitudinal mode laser, means such as a notch filter or bandpass filter may be added to the light path (not illustrated in either FIG. 2A or FIG. 2B) to limit the wavelengths of the light emitted by the laser so that upon reaching the resonance cell the laser light excites only one of the hyperfine ground states.

The intensity of laser light emitted by laser 251, in combination with the amount of time for which the laser light is allowed to irradiate the resonance cell, may be co-selected so as to substantially completely saturate optical pumping of the excited hyperfine ground state. For example, the more intense the laser light, the shorter the time required to saturate the optical pumping process. Here, the time to saturate the optical pumping process is the time required to maximize the atomic population imbalance between the two hyperfine ground states. This saturation intensity may be expressed as the ration $Fs/g_1$, where F is the photon flux, s is the optical absorption cross section, and $g_1$ is the rate at which processes (e.g., collisions) equilibrate the populations in the two ground-state hyperfine levels. The value of $g_1$ may be on the order of 100 to 1000 Hz. The amount of time for which light from laser 251 is inhibited from optically pumping the alkali vapor in resonance cell 221 may be selected so as to be sufficient for light from light source 201 to probe the absorption of the alkali vapor in the resonance cell resulting from the optical pumping. The repetition rate (ON/OFF frequency of optical gate 252, or of pulses from laser 251) may be selected so as to provide sufficient time both for optically pumping the alkali vapor in resonance cell 221 (by laser 251) and for optically probing the excited alkali in the resonance cell 221 (by light source 201).

The light from laser 251 may be guided to resonance cell 221 using any suitable combination of optical components. In the nonlimiting example illustrated in FIG. 2A, mirror 271 may reflect the light from laser 251 towards beamsplitter 272 (e.g., a polarizing or non-polarizing beamsplitter), and beamsplitter 272 may reflect the light from laser 251 in a manner so as to be collinear with the light from light source 201 and thus irradiate resonance cell 221. However, the light from laser 251 and from light source 201 need not necessarily be collinear. For example, light from laser 251 and from light source 201 may be arranged so as to interact with the same atoms as one another, e.g., may partially or fully overlap one another in a non collinear fashion, and indeed need not necessarily overlap with one another at all. Other example arrangements of components in physics package 200 are described further below with reference to FIGS. 4A-4D.

As noted further above, at the particular time illustrated in FIG. 2A, controller circuitry 281 allows light from laser 251 to optically pump the alkali vapor (e.g., $Rb^{87}$ vapor) in resonance cell 221 from the first hyperfine ground state to the excited state, e.g., by controlling optical gate 252 to an "ON" state while maintaining the laser in an "ON" state, or by otherwise pulsing the laser, turning the laser on temporarily, or the like. Additionally, at the particular time illustrated in FIG. 2A, controller circuitry 281 may control photodetector 231 so as to be in an "OFF" state. For example, photodetector 231 may be or include a gated photodiode that controller circuitry 281 controls to be "OFF" while light from laser 251 is irradiating resonance cell 221. As such, photodetector 231 may not generate any signal based directly upon excitation light received from laser 251. Additionally, photodetector 231 receives probe light from light source 201 through resonance cell 221, but may not generate any signal based thereon at this time. Note that the photodetector gating may be performed electronically. Alternatively, signal processing may be limited so as only to analyze the signal when the laser is in an "OFF" state as described with reference to FIG. 2B. For example, the signal from the photodetector may be digitized at all times, and the portions of the signal when the laser was "ON" may be digitally removed or ignored.

At the particular time illustrated in FIG. 2B, controller circuitry 281 allows photodetector 231 to receive light from light source 201 through resonance cell 221 while inhibiting light from laser 251 from optically pumping the alkali vapor (e.g., $Rb^{87}$ vapor) in the resonance cell. For example, controller circuitry 281 may switch optical gate 252 to an "OFF" state while maintaining laser 251 in an "ON" state such that the optical gate inhibits the laser from optically pumping the alkali vapor in the resonance cell at the second time. Alternatively, if laser 251 is pulsed, controller circuitry 281 may allow photodetector 231 to receive light from light source 201 during a time between the pulses from the laser. As yet another alternative, controller circuitry 281 may turn off the laser temporarily, or the like. In a manner similar to that described with reference to FIG. 1, the light source 201 is used to monitor the absorption of the alkali vapor (e.g., $Rb^{87}$ vapor) within resonance cell 221 via the intensity of light that photodetector 231 receives. In a manner similar that described with reference to FIG. 1, the frequency of the crystal oscillator (not illustrated) may be corrected so as to tune the frequency of microwave cavity 241 in such a manner as to transfer the maximum number of electrons from, for example, the F=2 level of $Rb^{87}$ to the F=1 level of $Rb^{87}$ where they may absorb the maximum amount of filtered light from light source 201 and thus minimize the amount of light received by photodetector 231. The corrected frequency of the crystal oscillator, which is locked to a feature in the ground-state hyperfine absorption spectrum of the alkali vapor (e.g., a line connecting the two $Rb^{87}$ hyperfine ground states), provides the frequency of the atomic clock including physics package 200.

Figure 1:
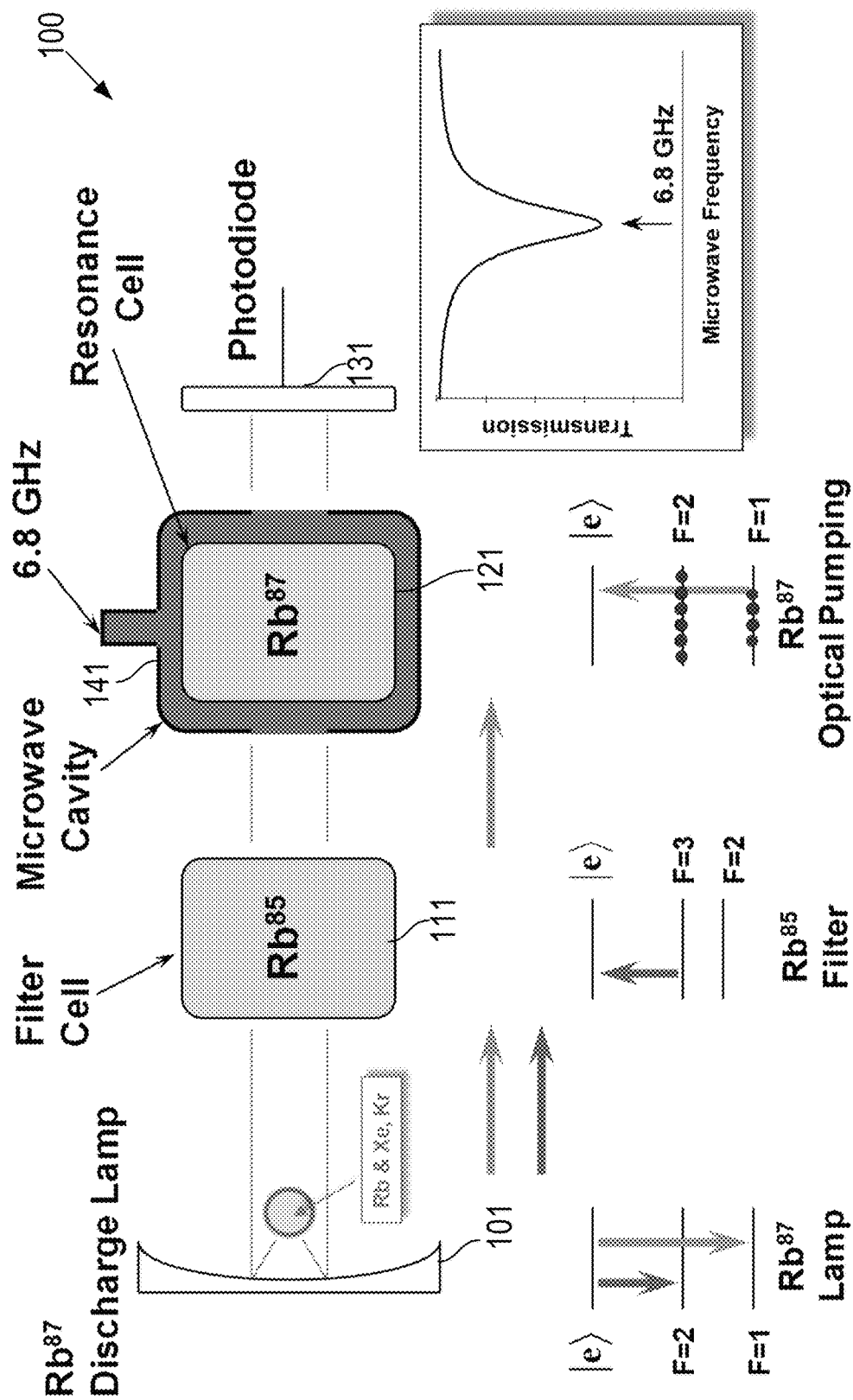
FIG. 1 schematically illustrates a previously known physics package for a rubidium atomic frequency standard (RAFS) atomic clock for use in global positioning system (GPS) satellites (GPS-RAFS).

However, because light source 201 need not optically pump the alkali vapor, which instead is done by laser 251 in physics package 200, the light source may be used to generate significantly lower levels of light than would be needed for the discharge lamp in physics package 100 described with reference to FIG. 1. For example, light source 201 may be operated at a relatively low power and a relatively low temperature in a manner such as illustrated in FIGS. 2A-2B. As such, in physics package 200 illustrated in FIGS. 2A-2B, light source 201 (which in some examples may include a discharge lamp) may be expected to have a significantly longer life as compared to discharge lamp 101, thus extending the expected service life of an atomic clock including physics package 200. Additionally, light source 201 may be expected to have lower changes in the intensity of light, and thus may be expected to cause fewer changes to the frequencies to which microwave cavity 241 and the crystal oscillator are tuned as compared to discharge lamp 101, resulting in greater long-term stability using physics package 200.

Figure 3:
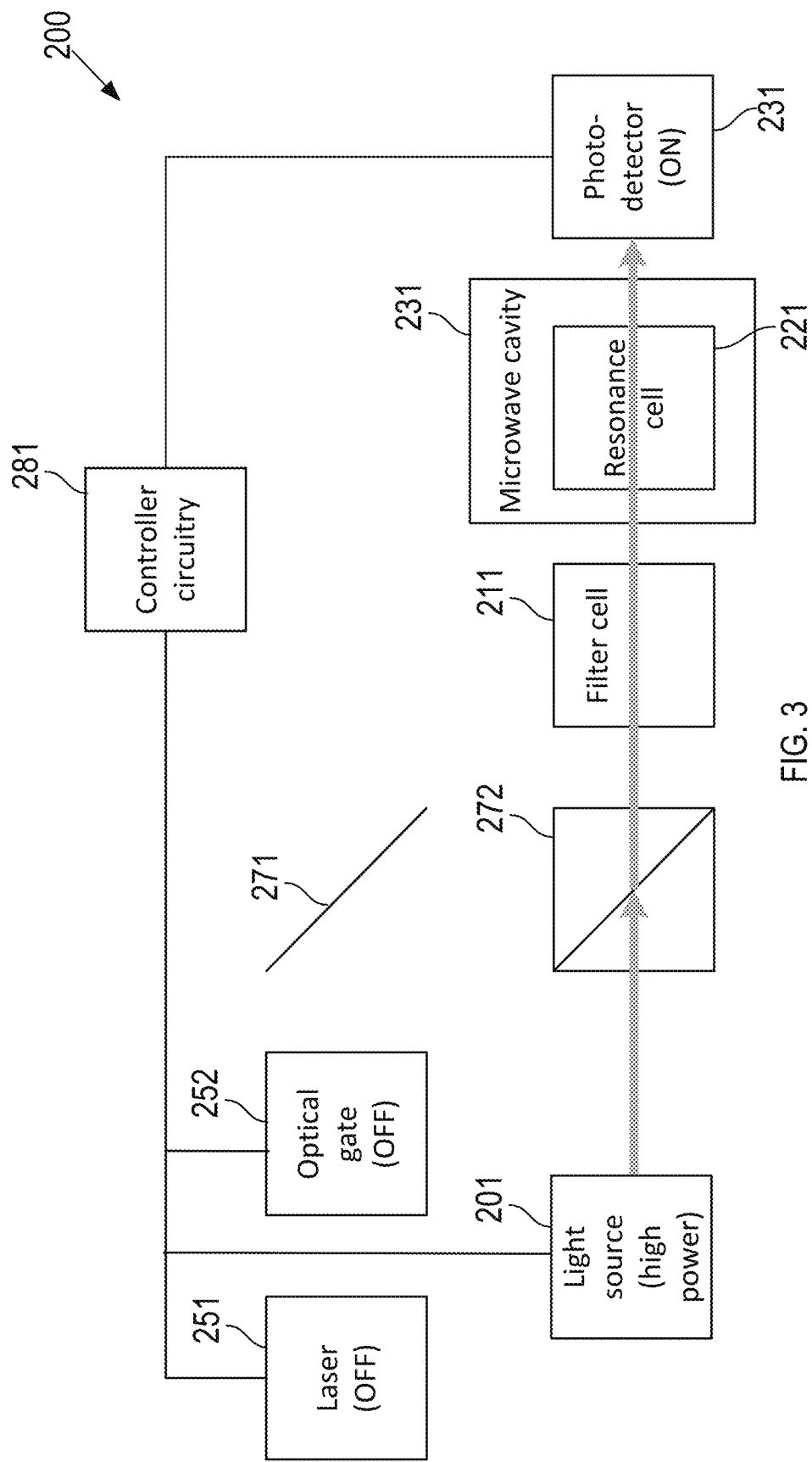
FIG. 3 schematically illustrates the example LaLI-POP physics package of FIGS. 2A-2B in a second mode of operation such as provided herein.

Additionally, physics package 200 optionally may be used in different modes of operation. FIGS. 2A-2B illustrate a first mode of operation, e.g., in which laser 251 is used to optically excite the alkali vapor (e.g., $Rb^{87}$ or $Cs^{133}$ vapor) in resonance cell 221, and in which light source 201 is used only to optically probe absorption in resonance cell 221 resulting from such optical excitation. In some circumstances, it may be desirable to use light source 201 as an optical excitation source as well as an optical probe in a manner such as described with reference to FIG. 1. For example, laser 251 may have a limited lifetime, and may not readily be serviced or replaced if located on a satellite. FIG. 3 schematically illustrates the example LaLI-POP physics package of FIGS. 2A-2B in a second mode of operation such as provided herein, e.g., in which light source 201 is used both to optically excite and optically probe absorption of the alkali vapor in resonance cell 221 resulting from such optical excitation.

In the mode illustrated in FIG. 3, laser 251 and optical gate 252 are in "OFF" states, whether under control from controller circuitry 281 or because one or both of such components have failed. Controller circuitry 281 switches light source 201 to a high power state in which the light source generates a sufficient amount of light to both optically excite and optically probe the alkali vapor (e.g., $Rb^{87}$ or $Cs^{133}$ vapor) in the resonance cell. Controller circuitry 281 allows photodetector 231 to receive light source light from the resonance cell 221 while inhibiting light from laser 251 from optically pumping the alkali vapor in the resonance cell. For example, controller circuitry 281 may switch optical gate 252 to an "OFF" state while maintaining laser 251 in an "ON" state, or otherwise may cause the laser not to pulse, may turn off the laser temporarily, or the like. In a manner similar that described with reference to FIG. 1, the frequency of the crystal oscillator (not illustrated) may be corrected so as to tune the frequency of microwave cavity 241 in such a manner as to transfer the maximum number of electrons from one hyperfine level to another hyperfine level where they may absorb the maximum amount of filtered light from light source 201 and thus minimize the amount of light received by photodetector 231. The corrected frequency of the crystal oscillator, which is locked to a feature in the absorption spectrum of the alkali vapor provides the frequency of the atomic clock including physics package 200.

It will be appreciated that physics package 200 may be considered to include a "backup" mode for correcting the frequency of an atomic clock's crystal oscillator even if laser 251 is not, or cannot be, used to excite the alkali vapor in resonance cell 221 at a particular time. Controller circuitry 281 may be configured to reversibly switch between the laser-excitation mode described with reference to FIGS. 2A-2B, and the light-source-excitation mode described with reference to FIG. 3. Alternatively, controller circuitry 281 may be configured to irreversibly switch from the laser-excitation mode to the light-source-excitation mode responsive, for example, to detecting that laser 251 or optical gate 252 has failed or otherwise does not meet performance specifications. For example, controller circuitry 281 may be configured to switch (optionally irreversibly) from the laser-excitation mode to the light-source-excitation mode in response to detecting that during periods when the laser light is "ON", the amount of light reaching the photodetector decreases significantly, indicating that the laser is not outputting enough power any more. Additionally, or alternatively, controller circuitry 281 may be configured to switch (optionally irreversibly) from the laser-excitation mode to the light-source-excitation mode in response to detecting that during periods when the laser light is "OFF", the amount of light reaching the photodetector increases significantly, indicating that optical pumping has become inefficient. Additionally, or alternatively, controller circuitry 281 may be configured to switch (optionally irreversibly) from the laser-excitation mode to the light-source-excitation mode in response to detecting that the short-term stability of light reaching the photodetector has degraded significantly, e.g., by about 50-100%.

Additionally, it will be appreciated that although certain examples herein describe optically exciting and optically probing $Rb^{87}$ or $Cs^{133}$ vapor, physics package 200 suitably may be modified for use with other alkali metals such as sodium or potassium which need not necessarily use a filter cell.

It will be appreciated that physics package 200 may be used in any suitable environment and in any suitable sequence of operations. For example, it may be utilized onboard a GPS satellite, onboard global navigation satellite system spacecraft, onboard military communication satellites, onboard small satellites, at cell-phone communication nodes or base stations, or on any other suitable stationary or mobile platform (e.g., air, ground, sea, or space) that suitably may power the atomic clock and may benefit from precise time. Without limitation, physics package 200 may be used in national security space applications such as GPS, milsatcom systems, SmallSat missions, and reconnaissance missions; ground defense applications such as mobile timekeeping or GPS denied environments; or civil applications such as timekeeping at cellular communications base stations, time-tagging financial transactions, or GPS-disciplined clocks for metrology laboratories. It should be noted that physics package 200 suitably may be operated using a few Watts of power (e.g., about 2-50 W, or about 5-20 W) and thus readily may be utilized in a variety of power-limited environments.

Figure 4A:
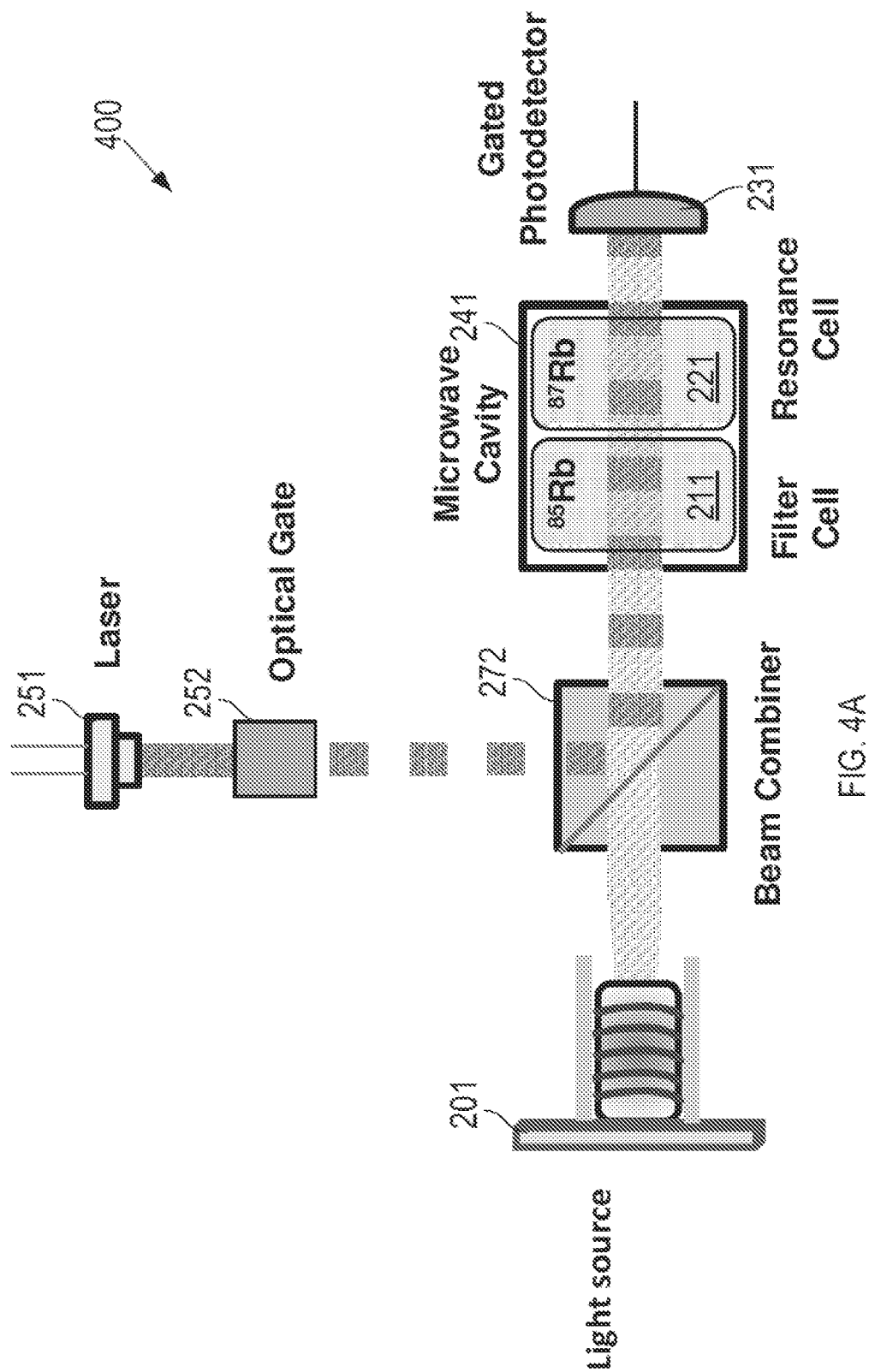
FIGS. 4A-4D schematically illustrate example alternative arrangements of a LaLI-POP physics package.
Figure 4B:
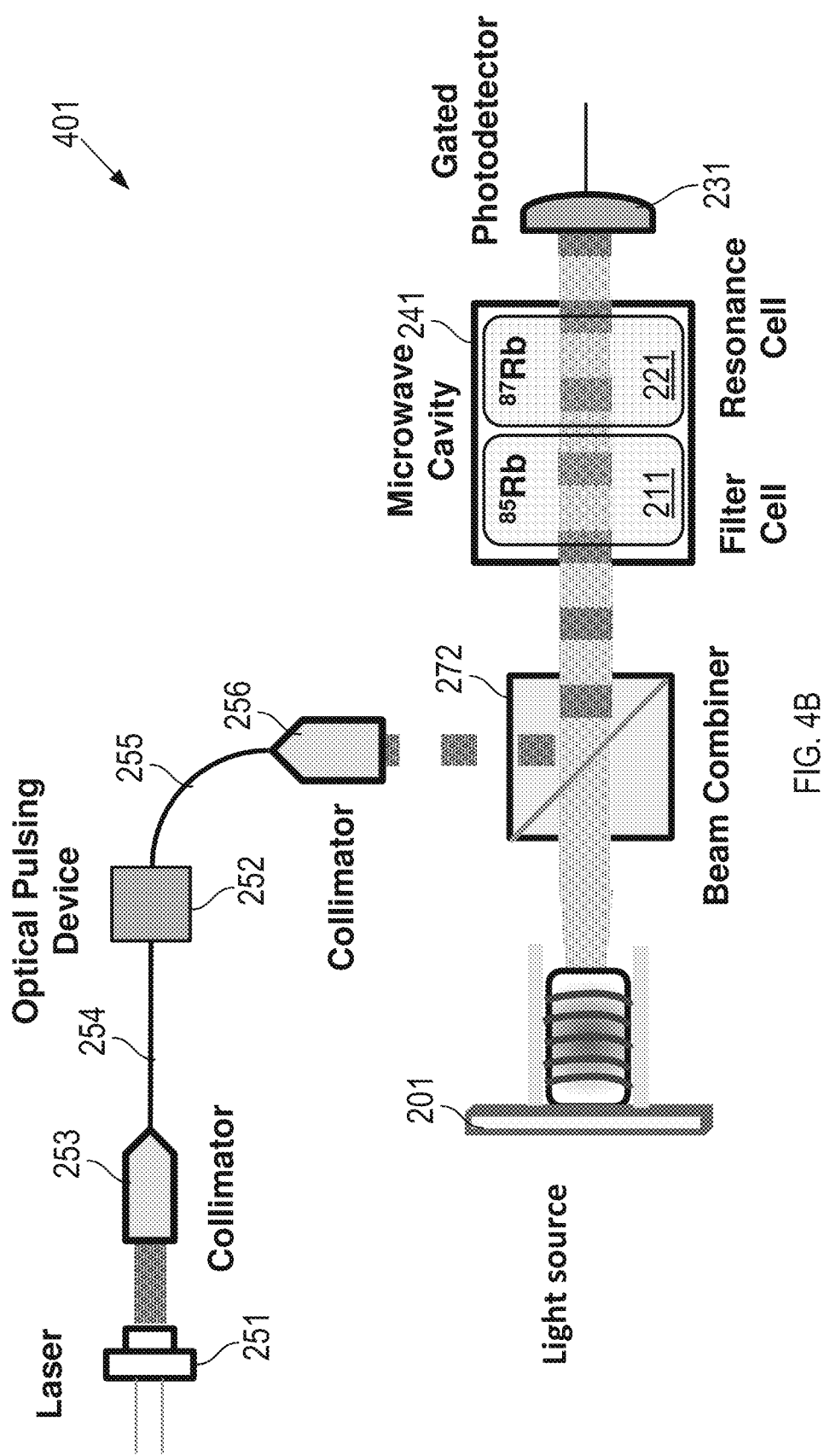

It will be appreciated that FIGS. 2A-2B and 3 illustrate only one example arrangement of elements of LaLI-POP physics package 200, and that other arrangements suitably may be used. For example, FIGS. 4A-4D schematically illustrate example alternative arrangements of a LaLI-POP physics package. Referring now to FIG. 4A, physics package 400 may have a "free-space" arrangement in which the beam from laser 251 passes through optical gate 252 which may be controlled by control circuitry (not specifically illustrated) in a manner such as described with reference to FIGS. 2A-2B. The beam from laser 251 then may be reflected by, or transmitted through, one or more optical components making the beam collinear with light from light source 201. For example, beam combiner 272 may include a beamsplitter or polarizing beamsplitter that transmits light from light source 201 and reflects light from laser 251 in a manner such as illustrated in FIG. 4B, or that transmits light from laser 251 and reflects light from light source 201. The combined beam then may be transmitted into microwave cavity 241 within which filter cell 211 and resonance cell 221 may be located, and then irradiate gated photodetector 231. The light from light source 201 may be detected by photodetector 231 during times when the beam from laser 251 is not irradiating the photodetector.

Physics package 401 illustrated in FIG. 4B may have a hybrid "free-space with fiber coupling" arrangement in which the beam from laser 251 passes into collimator 253 and from there into fiber 254, then optical pulsing device 252 such as a semiconductor optical amplifier, which may be controlled by control circuitry (not specifically illustrated) in a manner such as described with reference to FIGS. 2A-2B. The beam from laser 251 then may be transmitted through fiber 255 (which may be a continuation of fiber 254) and through another collimator 256 that returns the beam to free-space transmission. The beam then is reflected by, or transmitted through, one or more free-space optical components making the beam collinear with light from light source 201. For example, beam combiner 272 may include a beamsplitter or polarizing beamsplitter that transmits light from light source 201 and reflects light from laser 251 in a manner such as illustrated in FIG. 4B, or that transmits light from laser 251 and reflects light from light source 201. The combined beam then may be transmitted into microwave cavity 241 within which filter cell 211 and resonance cell 221 may be located, and then irradiate gated photodetector 231. The light from light source 201 may be detected by photodetector 231 during times when the beam from laser 251 is not irradiating the photodetector in a manner such as described with reference to FIG. 2B.

Figure 4C:
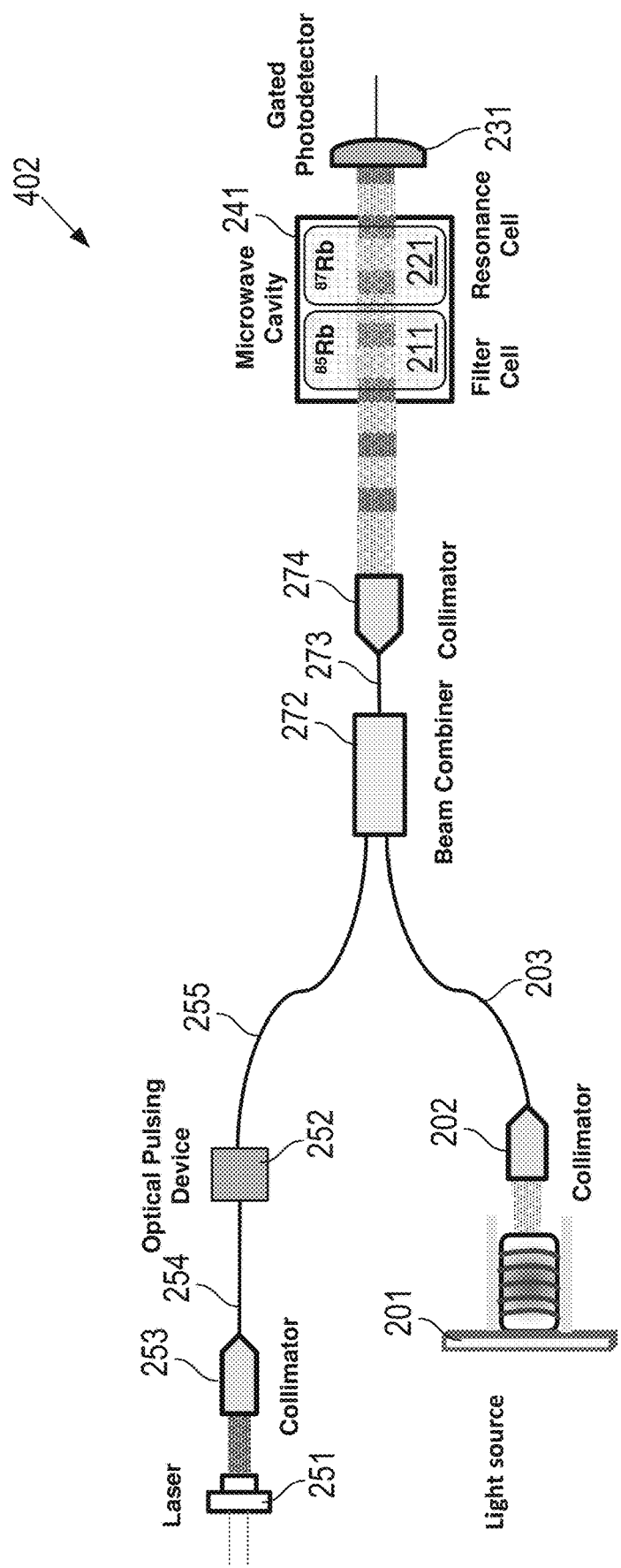

Physics package 402 illustrated in FIG. 4C may have a different hybrid "free-space with fiber coupling" arrangement in which the beam from laser 251 passes into collimator 253 and from there into fiber 254, then optical pulsing device 252 such as a semiconductor optical amplifier, which may be controlled by control circuitry (not specifically illustrated) in a manner such as described with reference to FIGS. 2A-2B. The beam from laser 251 then may be transmitted through fiber 255 (which may be a continuation of fiber 254) and is reflected by, or transmitted through, one or more fiber-based optical components making the beam collinear with light from light source 201. For example, beam combiner 272 may include a fiber optic coupler or splitter. Beam combiner 272 may receive light from laser 251 via fiber 255, and may receive light from light source 201 via collimator 202 and fiber 203 in a manner such as illustrated in FIG. 4B. The combined beam then may be transmitted through fiber 273 and into collimator 274 which returns the combined beams to free-space transmission into microwave cavity 241 within which filter cell 211 and resonance cell 221 may be located. The combined beam then may irradiate gated photodetector 231. The light from light source 201 may be detected by photodetector 231 during times when the beam from laser 251 is not irradiating the photodetector in a manner such as described with reference to FIG. 2B.

Figure 4D:
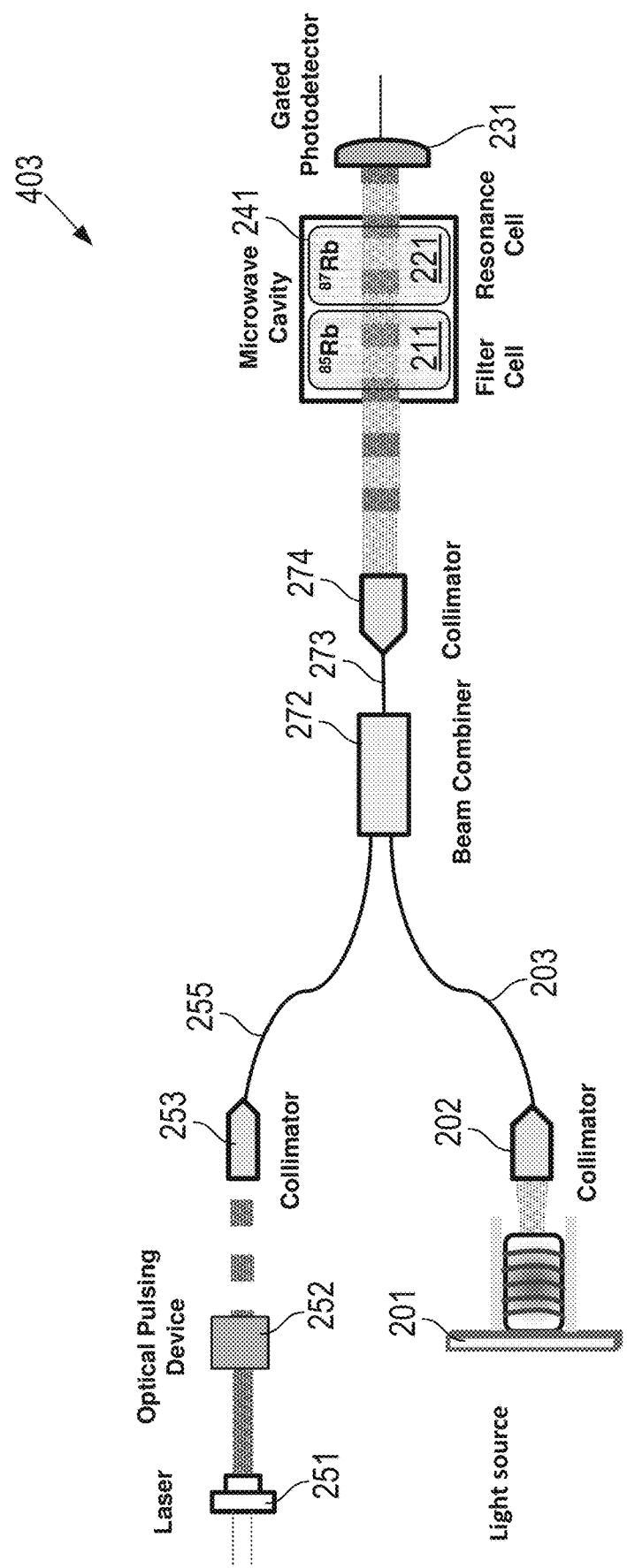

Physics package 403 illustrated in FIG. 4D may have a different hybrid "free-space with fiber coupling" arrangement in which the beam from laser 251 passes directly into optical pulsing device 252 such as a semiconductor optical amplifier, which may be controlled by control circuitry (not specifically illustrated) in a manner such as described with reference to FIGS. 2A-2B. The beam from laser 251 then may be transmitted into collimator 253 and from there through fiber 255 and is reflected by, or transmitted through, one or more fiber-based optical components making the beam collinear with light from light source 201. For example, beam combiner 272 may include a fiber optic coupler or splitter. Beam combiner 272 may receive light from laser 251 via fiber 255, and may receive light from light source 201 via collimator 202 and fiber 203 in a manner such as illustrated in FIG. 4B. The combined beam then may be transmitted through fiber 273 and into collimator 274 which returns the combined beams to free-space transmission into microwave cavity 241 within which filter cell 211 and resonance cell 221 may be located. The combined beam then may irradiate gated photodetector 231. The light from light source 201 may be detected by photodetector 231 during times when the beam from laser 251 is not irradiating the photodetector in a manner such as described with reference to FIG. 2B.

Figure 5:
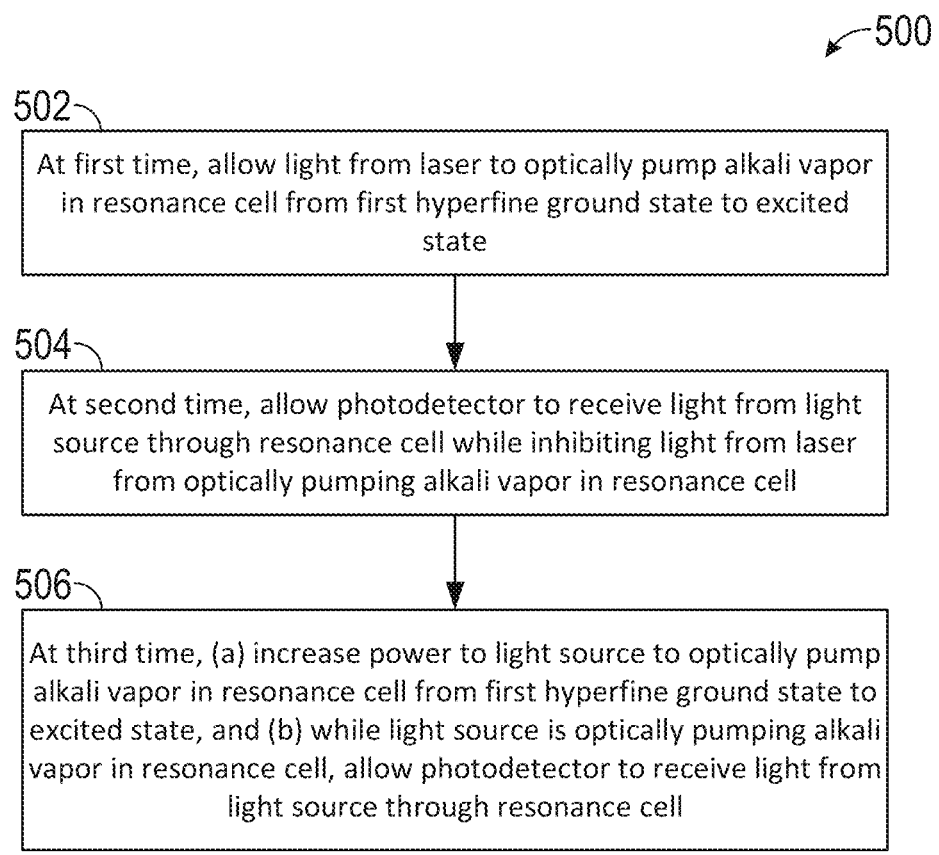
FIG. 5 illustrates operations in an example method of using a LaLI-POP physics package in an atomic clock.

FIG. 5 illustrates operations in an example method of using a LaLI-POP physics package in an atomic clock. The atomic clock may include a resonance cell storing an alkali vapor having first and second hyperfine ground states and an excited state, a light source configured to transmit light through the resonance cell at a frequency corresponding to electronic decay from the excited state to the first hyperfine ground state, and a photodetector configured to receive the light from the light source, e.g., in a manner such as described with reference to FIGS. 2A-2B. Method 500 illustrated in FIG. 5 may include, at a first time, allowing light from a laser to optically pump the alkali vapor in the resonance cell from the first hyperfine ground state to the excited state (operation 502). For example, laser 251 described with reference to FIGS. 2A-2B and 4A-4D may optically pump the alkali vapor, such as $Rb^{87}$ vapor or $Cs^{133}$ vapor. The light from the laser optionally may be filtered by a filter cell, e.g., $Rb^{85}$ filter cell such as described with reference to FIG. 2A, prior to arriving at the resonance cell. The light from laser 251 may be pulsed or gated, e.g., using optical gate 252. Method 500 illustrated in FIG. 5 includes, at a second time, allowing the photodetector to receive light from the light source through the resonance cell while inhibiting light from the laser from optically pumping the alkali vapor in the resonance cell (operation 504). For example, controller 281 described with reference to FIGS. 2A-2B and 4A-4D may close the optical gate 252, the pulse from laser 251 may end, or light from the laser otherwise may be inhibited from irradiating resonance cell 221. Optionally, method 500 illustrated in FIG. 5 further may include, at a third time, (a) increasing the power to the light source to optically pump the alkali vapor in the resonance cell from the first hyperfine ground state to the excited state, and (b) while the light source is optically pumping the alkali vapor in the resonance cell, allowing the photodetector to receive the light from the light source through the resonance cell. For example, controller 281 may switch physics package from a laser-excitation mode provided by operations 502 and 504, to a light-source-excitation mode provided by operation 506 in a manner such as described with reference to FIG. 3.

Figure 6:
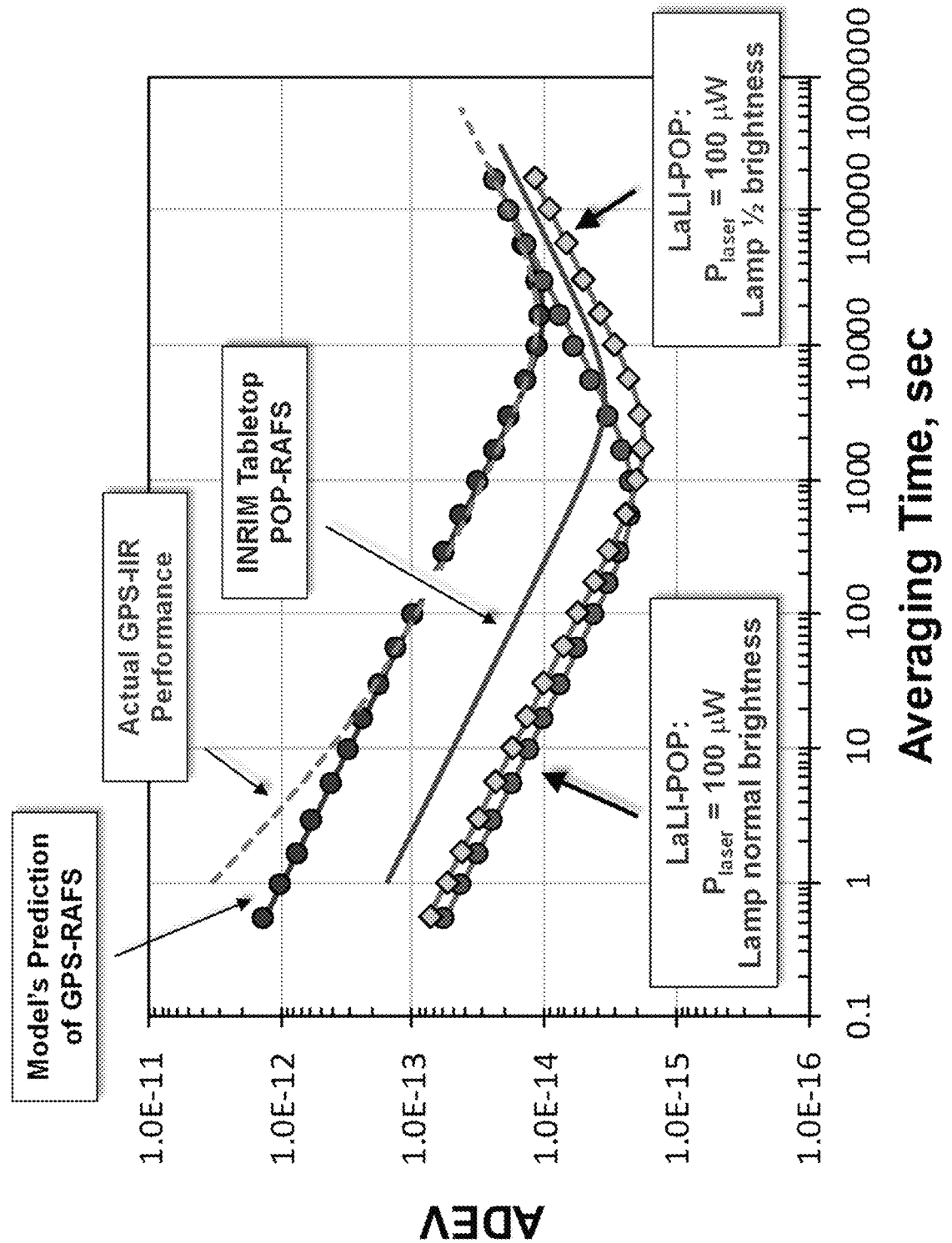
FIG. 6 is a plot comparing performance of an example LaLI-POP physics package provided herein, as compared to that of previously known physics packages.

FIG. 6 is a plot comparing performance of an example LaLI-POP physics package provided herein, as compared to that of previously known physics packages. More specifically, FIG. 6 illustrates the anticipated performance of a GPS atomic clock including physics package 200, or including previously known physics packages, in term of their Allan deviation (ADEV). Allan deviation is a measure of frequency instability, and as such, a lower Allan deviation indicates a more stable atomic clock. The physics packages included a model of the GPS-RAFS physics package 100 described with reference to FIG. 1 ("Model's prediction of GPS-RAFS"); the PerkinElmer rubidium frequency standard physics package for the Boeing Block IIR GPS space vehicle described in Dupuis et al., "Rubidium frequency standard for the GPS IIF program and modifications for the RAFSMOD program," 2008 IEEE International Frequency Control Symposium: 655-660 (2008), the entire contents of which are incorporated by reference herein ("Actual GPS-IIR performance"); the pulsed optically pumped physics package described in Levi et al., "Pulsed optically pumped Rb clock: a high stability vapor cell frequency standard," 2013 Joint UFFC, EFTF and PFM Symposium: 599-605 (2013), the entire contents of which are incorporated by reference herein ("INRIM tabletop POP-RAFS"); and a model of the LaLI-POP physics package 200 using a $Rb^{87}$ vapor and Rb discharge lamp and operating in the laser-excitation mode described with reference to FIGS. 2A-2B. The performance of the atomic clock using the GPS-RAFS physics package 100 and the LaLI-POP physics package 200 were modeled using atomic clock model discussed in Camparo and Frueholz, "A nonempirical model of the gas-cell atomic frequency standard," Journal of Applied Physics 59: 301-312 (1986), the entire contents of which are incorporated by reference herein. The LaLI-POP physics package was modeled to have a laser power of 100 μW and a total lamp brightness either of 100 μW ("lamp normal brightness") or of half that power ("lamp ½ brightness"). The lamplight brightness used in the computations corresponds to lamplight brightness in actual RAFS as discussed in the paper by Camparo and Frueholz.

As may be seen in FIG. 6, each of the physics packages has a relatively high ADEV at relatively short averaging times (e.g., at the shortest time that was modeled or measured, about 0.5 seconds) which decreases to a minimum and then increases again at relatively long averaging times (e.g., at the longest time that was modeled or measured, about $10^5$-$10^6$ seconds. The GPS-RAFS model and the actual GPS-IIR performance were good agreement with one another (indicating that the LaLI-POP model similarly may be expected to be in good agreement with actual performance of an as-built LaLI-POP physics package), having a minimum ADEV of about $1.0 \times 10^{-14}$ at an averaging time of about 11,000 seconds, although the ADEV of the actual GPS-IIR was somewhat higher than that of the GPS-RAFS model at averaging times less than about 100 seconds. The INRIM tabletop POP-RAFS was observed to have a lower ADEV than that of the GPS-IIR and GPS-RAFS model at all averaging times illustrated in FIG. 6, with a minimum ADEV of about $3 \times 10^{-15}$ at an averaging time of about 5000 seconds. The LaLI-POP model with the lamp at ½ brightness was observed have a lower ADEV than that of the INRIM tabletop POP-RAFS, the GPS-IIR, and the GPS-RAFS model at all averaging times illustrated in FIG. 6, with a minimum ADEV of about $2 \times 10^{-15}$ at an averaging time of about 2000 seconds. The LaLI-POP model with the lamp at full brightness was observed have a lower ADEV than that of the GPS-RAFS model and the GPS-IIR at averaging times less than about 12,000 seconds and a similar ADEV as the GPS-RAFS model and the GPS-IIR at averaging times of more than about 12,000 seconds, and a lower ADEV than that of the INRIM tabletop POP-RAFS at averaging times less than about 1100 seconds, with a minimum ADEV of about $2\times10^{-15}$ at an averaging time of about 1000 seconds.

From a comparison of the ADEVS illustrated in FIG. 6, it may be understood that the LaLI-POP physics package may be expected to have an Allan deviation that is less than that of previously known physics packages at some, if not all, averaging times. In particular, it may be expected that because the discharge lamp (or other light source) may be used only as an optical probe in the LaLI-POP physics package (in the laser-excitation mode described with reference to FIGS. 2A-2B), a lower discharge lamp brightness (e.g., half the power of the lamp used in GPS-RAFS) suitably may be used and may lead to significantly reduced Allan deviation as compared to that of previously known physics packages, such as the INRIM tabletop POP-RAFS, the GPS-IIR, and the GPS-RAFS model, at relevant averaging times such as illustrated in FIG. 6. Although the ADEV of the LaLI-POP with the lamp at ½ brightness was slightly higher than that of the LaLI-POP with the lamp at full brightness at averaging times of about 1000 seconds and less, the LaLI-POP with the lamp at ½ brightness had substantially lower ADEV at averaging times of greater than about 1000 seconds which may be expected to compensate for the slightly worse performance at the shorter times. As such, operating the discharge lamp of the LaLI-POP at lower temperature and lower power—e.g., as compared to the GPS-RAFS and even as compared to the LaLI-POP at higher discharge lamp power—may be expected to significantly benefit clock frequency stability, for example by reducing the ac-Stark shift that increases with higher lamp power.

Figure 7:
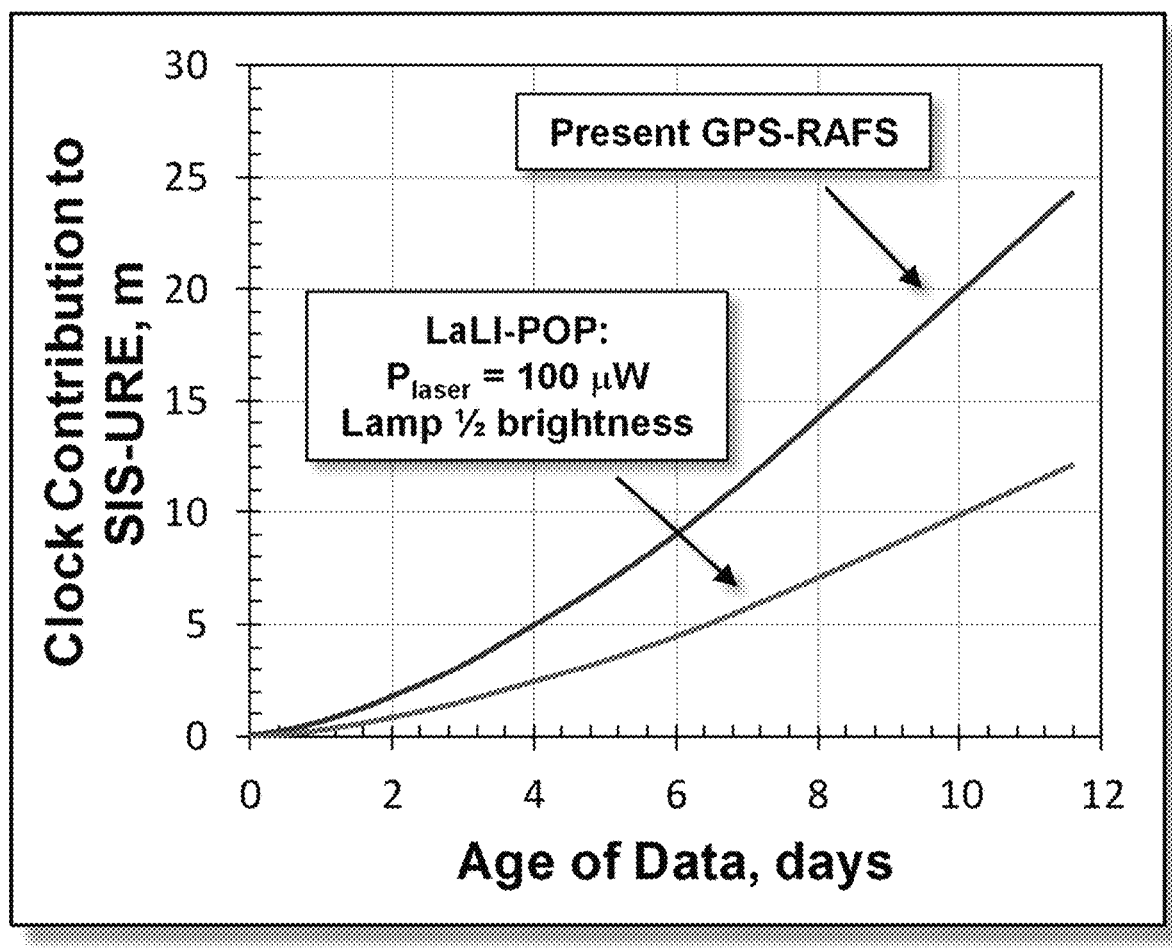
FIG. 7 is a plot comparing the clock's contribution to the signal-in-space user-range-error (SIS-URE) for a global navigation satellite system of an example LaLI-POP physics package provided herein, as compared to that of a previously known physics package.

FIG. 7 is a plot comparing the clock's contribution to the signal-in-space user-range-error (SIS-URE) for a global navigation satellite system of an example LaLI-POP physics package provided herein, as compared to that of a previously known physics package. More specifically, the respective clock contributions to SIS-URE were calculated for (a) the model of the LaLI-POP physics package with the discharge lamp at ½ brightness described with reference to FIG. 6, and (b) the GPS-RAFS model described with reference to FIG. 6. The time for a signal to travel from a satellite to a receiver was calculated, and this propagation time was multiplied by the speed of light to obtain the range. Errors in the timing of an atomic clock on the satellite generate errors in the estimated range to the receiver, and these errors are referred to as SIS-URE. From FIG. 7, it may be seen that the clock contribution to SIS-URE for the LaLI-POP with the lamp at ½ brightness may be expected to be significantly lower than that of GPS-RAFS at all times. For example, the clock contribution to SIS-URE for the LaLI-POP may be about half of that for the GPS-RAFS, e.g., about 10 meters after 10 days for LaLI-POP, as compared to about 20 meters after 10 days for GPS-RAFS. In GPS (as well as other global navigation satellite systems), the atomic clock may be a major contributor to the SIS-URE. As such, reducing the clock's contribution to SIS-URE, as does the present LaLI-POP physics package, may directly enhance the accuracy of GPS or other global navigation satellite systems.

From the foregoing, it will be appreciated that the present LaLI-POP physics packages may provide several benefits over previously known physics packages. For example, one of the major life-limiting mechanisms for GPS-RAFS is discharge lamp failure. Briefly, the discharge lamp may include a glass bulb storing Rb vapor at a pressure of a few hundred microTorr along with several Torr of a noble gas, such as Kr or Xe. The glass bulb sits within the inductor coils of a Colpitts or Hartley oscillator circuit that is resonant at about $10^2$ MHz, and which supplies the RF power to maintain the discharge and generate light. These RF discharge lamps may fail due to either or both of two processes: 1) loss of Rb to consumption by the bulb's glass walls, or 2) loss of the noble gas to consumption by the bulb's glass walls. The present LaLI-POP physics packages need not use the discharge lamp to optically pump the alkali vapor resonant cell but rather to probe such cell (e.g., in laser-excitation mode), then the discharge lamp (or other light source) may be used at lower power and/or lower temperature, which may reduce the rate of loss of Rb and/or noble gas to the glass walls. Consequently, the present LaLI-POP physics packages mitigate a known life-limiting mechanism that affects GPS-RAFS.

It may be difficult to predict the lifetime in the space environment of lasers such as used in the LaLI-POP physics package (e.g., diode lasers). As such, failure of the laser may be a life-limiting mechanism for the laser-excitation mode such as described with reference to FIGS. 2A-2B. However, because the LaLI-POP physics package may be switched to a light-source-excitation mode such as described with reference to FIG. 3, the physics package suitably may continue to be used for correcting the crystal oscillator frequency, albeit with higher clock instability and SIS-URE as compared to the laser-excitation mode (but nonetheless meeting the industry standard).

While preferred embodiments of the invention are described herein, it will be apparent to one skilled in the art that various changes and modifications may be made. The appended claims are intended to cover all such changes and modifications that fall within the true spirit and scope of the invention.

What is claimed is:

1. A physics package for an atomic clock, the atomic clock including a resonance cell storing an alkali vapor having first and second hyperfine ground states and an excited state, a light source configured to transmit light through the resonance cell at a frequency corresponding to electronic decay from the excited state to the first hyperfine ground state, and a photodetector configured to receive the light from the light source, the physics package comprising:
    a laser; and
    controller circuitry configured to:
        at a first time, allow light from the laser to optically pump the alkali vapor in the resonance cell from the first hyperfine ground state to the excited state, and
        at a second time, allow the photodetector to receive lamp light from the light source through the resonance cell while inhibiting light from the laser from optically pumping the alkali vapor in the resonance cell.

2. The physics package of claim 1, wherein the alkali vapor in the resonance cell comprises $Rb^{87}$, the light source comprises a $Rb^{87}$ discharge lamp, and the physics package further comprises a $Rb^{85}$ filter cell disposed between the $Rb^{87}$ discharge lamp and the resonance cell, and a microwave cell configured to transfer electrons of the alkali vapor from the second hyperfine ground state to the first hyperfine ground state.

3. The physics package of claim 1, wherein the alkali vapor in the resonance cell comprises $Cs^{133}$, the light source comprises a light emitting diode, and the physics package further comprises a microwave cell configured to transfer electrons of the alkali vapor from the second hyperfine ground state to the first hyperfine ground state.

4. The physics package of claim 1, wherein the laser comprises a pulsed laser.

5. The physics package of claim 1, wherein further comprising an optical gate configured to inhibit the laser from optically pumping the alkali vapor in the resonance cell at the second time.

6. The physics package of claim 5, wherein the optical gate comprises an optical pulsing device, acousto-optic modulator, liquid crystal switch, shutter, mechanical chopper, or electro-optical modulator or photo-elastic modulator paired with a polarizer.

7. The physics package of claim 1, further comprising one or more optical components making a beam from the laser collinear with light from the light source.

8. The physics package of claim 1, wherein the controller circuitry gates the photodetector.

9. The physics package of claim 1, wherein the controller circuitry further is configured to, at a third time:
increase power to the light source to optically pump the alkali vapor in the resonance cell from the first hyperfine ground state to the excited state; and
while the light source is optically pumping the alkali vapor in the resonance cell, allow the photodetector to receive the light from the light source through the resonance cell.

10. The physics package of claim 1, further comprising one or more optical fibers carrying light from the light source or from the laser.

11. The physics package of claim 1, wherein the light source comprises a discharge lamp.

12. A method for use with an atomic clock, the atomic clock including a resonance cell storing an alkali vapor having first and second hyperfine ground states and an excited state, a light source configured to transmit light through the resonance cell at a frequency corresponding to electronic decay from the excited state to the first hyperfine ground state, and a photodetector configured to receive the light from the light source, the method comprising:
at a first time, allowing light from a laser to optically pump the alkali vapor in the resonance cell from the first hyperfine ground state to the excited state, and
at a second time, allowing the photodetector to receive light from the light source through the resonance cell while inhibiting light from the laser from optically pumping the alkali vapor in the resonance cell.

13. The method of claim 12, wherein the alkali vapor in the resonance cell comprises $Rb^{87}$, the light source comprises a $Rb^{87}$ discharge lamp, a $Rb^{85}$ filter cell is disposed between the $Rb^{87}$ discharge lamp and the resonance cell, and a microwave cell transfers electrons of the alkali vapor from the second hyperfine ground state to the first hyperfine ground state.

14. The method of claim 12, wherein the alkali vapor in the resonance cell comprises $Cs^{133}$ the light source comprises a light emitting diode, and the physics package further comprises a microwave cell configured to transfer electrons of the alkali vapor from the second hyperfine ground state to the first hyperfine ground state.

15. The method of claim 12, wherein the laser comprises a pulsed laser.

16. The method of claim 12, wherein the laser is inhibited from optically pumping the alkali vapor in the resonance cell at the second time using an optical gate.

17. The method of claim 16, wherein the optical gate comprises an optical pulsing device, acousto-optic modulator, liquid crystal switch, shutter, mechanical chopper, or electro-optical modulator or photo-elastic modulator paired with a polarizer.

18. The method of claim 12, further comprising making a beam from the laser collinear with light from the light source.

19. The method of claim 12, the photodetector is gated by control circuitry.

20. The method of claim 12, further comprising, at a third time:
increasing power to the light source to optically pump the alkali vapor in the resonance cell from the first hyperfine ground state to the excited state; and
while the light source is optically pumping the alkali vapor in the resonance cell, allowing the photodetector to receive the light from the light source through the resonance cell.

21. The method of claim 12, wherein one or more optical fibers carry light from the light source or from the laser.

22. The method of claim 12, wherein the light source comprises a discharge lamp.

* * * * *